(12) United States Patent
Farchtchian et al.

(10) Patent No.: US 8,482,663 B2
(45) Date of Patent: Jul. 9, 2013

(54) LIGHT-EMITTING DIODE ARRANGEMENT, OPTICAL RECORDING DEVICE AND METHOD FOR THE PULSED OPERATION OF AT LEAST ONE LIGHT-EMITTING DIODE

(75) Inventors: Nadir Farchtchian, Berlin (DE); Günter Kirchberger, Sinzing (DE); Gerhard Kuhn, Köfering (DE); Monika Rose, München (DE); Michael Sailer, Wolfskofen (DE); Andreas Stich, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 517 days.

(21) Appl. No.: 11/630,742

(22) PCT Filed: Jun. 13, 2005

(86) PCT No.: PCT/DE2005/001053
§ 371 (c)(1),
(2), (4) Date: Feb. 5, 2008

(87) PCT Pub. No.: WO2006/002607
PCT Pub. Date: Jan. 12, 2006

(65) Prior Publication Data
US 2008/0297644 A1    Dec. 4, 2008

(30) Foreign Application Priority Data

Jun. 30, 2004  (DE) .......................... 10 2004 031 689
Aug. 31, 2004  (DE) .......................... 10 2004 042 185

(51) Int. Cl.
*H04N 5/222*    (2006.01)
*H05B 37/00*    (2006.01)
*H05B 39/00*    (2006.01)
*H05B 41/14*    (2006.01)

(52) U.S. Cl.
USPC .................................... 348/371; 315/241 P (58) Field of Classification Search
USPC ................... 348/370, 371; 315/241 P, 241 S; 362/249.02, 545, 555
See application file for complete search history.

(56) References Cited

U.S. PATENT DOCUMENTS 4,843,416 A    6/1989    Brower
4,963,798 A *  10/1990   McDermott .................. 315/312

(Continued)

FOREIGN PATENT DOCUMENTS

CN    1399347     8/2002
DE    41 07526    10/1991

(Continued)

OTHER PUBLICATIONS

English translation of Chinese Office Action issued on Jun. 13, 2008 in corresponding Chinese Application No. 200580022226.0.

(Continued)

*Primary Examiner* — Albert Cutler
(74) *Attorney, Agent, or Firm* — Fish & Richardson P.C.

(57) ABSTRACT

A light-emitting diode array is disclosed which has two light-emitting diodes which are connected in antiparallel with one another, and a power supply which is suitable for energizing the light-emitting diodes independently of one another in the forward direction. In addition, an optical recording apparatus and a method for the pulsed operation of a light-emitting diode are disclosed.

19 Claims, 3 Drawing Sheets

U.S. PATENT DOCUMENTS

| | | | |
|---|---|---|---|
| 5,324,962 | A | 6/1994 | Komoto et al. |
| 5,491,349 | A | 2/1996 | Komoto et al. |
| 5,837,995 | A | 11/1998 | Chow et al. |
| 5,848,301 | A * | 12/1998 | Nonaka .................. 396/56 |
| 5,956,158 | A * | 9/1999 | Pinzarrone et al. ........ 358/474 |
| 6,066,861 | A | 5/2000 | Höhn et al. |
| 6,185,240 | B1 | 2/2001 | Jiang et al. |
| 6,285,140 | B1 | 9/2001 | Ruxton |
| 6,299,329 | B1 * | 10/2001 | Mui et al. ................. 362/227 |
| 6,330,055 | B1 | 12/2001 | Higashino |
| 6,359,392 | B1 | 3/2002 | He |
| 6,525,386 | B1 | 2/2003 | Mills et al. |
| 6,547,249 | B2 | 4/2003 | Collins, III et al. |
| 6,696,784 | B2 * | 2/2004 | Yoshida et al. ............ 313/498 |
| 6,747,293 | B2 * | 6/2004 | Nitta et al. ................ 257/99 |
| 7,022,960 | B2 * | 4/2006 | Yamamoto et al. ......... 250/205 |
| 7,071,989 | B2 * | 7/2006 | Nakata ..................... 348/371 |
| 7,081,917 | B2 | 7/2006 | Shimoyama et al. |
| 7,332,365 | B2 * | 2/2008 | Nakamura et al. ........... 438/29 |
| 7,332,746 | B1 | 2/2008 | Takahashi et al. |
| 2002/0025157 | A1 | 2/2002 | Kawakami |
| 2002/0139987 | A1 | 10/2002 | Collins, III et al. |
| 2002/0191102 | A1 * | 12/2002 | Yuyama et al. ............. 348/370 |
| 2003/0048355 | A1 | 3/2003 | Shimoyama et al. |
| 2004/0075399 | A1 * | 4/2004 | Hall .......................... 315/291 |
| 2004/0080941 | A1 * | 4/2004 | Jiang et al. ................. 362/252 |
| 2004/0129944 | A1 * | 7/2004 | Chen .......................... 257/89 |
| 2004/0217364 | A1 * | 11/2004 | Tarsa et al. ................. 257/89 |
| 2005/0046739 | A1 * | 3/2005 | Voss et al. ................. 348/371 |

FOREIGN PATENT DOCUMENTS

| | | |
|---|---|---|
| DE | 19946449 | 3/2000 |
| DE | 10213464 | 10/2002 |
| DE | 10235888 | 2/2003 |
| DE | 20220900 | 7/2004 |
| EP | 1 160 883 | 12/2001 |
| JP | 04-365382 | 12/1992 |
| JP | 6-084491 | 10/1994 |
| JP | 2000-161995 | 6/2000 |
| JP | 2001-144331 | 5/2001 |
| JP | 2002-57376 | 2/2002 |
| JP | 2002-359402 | 12/2002 |
| KR | 100497143 | 6/2005 |
| WO | WO 98/12757 | 3/1998 |

OTHER PUBLICATIONS

"Preliminary Notice of Rejection", Application No. 09820721410, mailed on Nov. 13, 2009 (5 pages).

Schnitzer, I. and Yablonovitch, E., "30% External Quantum Efficiency from Surface Textured, Thin-Film Light-Emitting Diodes", *Appl. Phys. Lett.* vol. 63, No. 16, pp. 2174-2176, 1993.

Trost, L.A., "Vier Farben mit Zweifarben-LED", *Funkschau*, pp. 83, 1982.

Authorized officer: Rodriguez-Girones., *International Search Report*, PCT/DE2005/001053, Jan. 12, 2006.

"Translation of the Notification of Reasons for Refusal (type I office action)," Japanese Application No. 2007-518441, mailed on Nov. 5, 2010 (4 pages).

Yim, Y.H., "English translation of the Notice to File a Response", Korean Intellectual Property Office, Korean Appl. No. 10-2007-7001685, mailed on Aug. 23, 2011 (5 pages).

Japan Patent Office, "Translation of the Decision of Refusal", JP Pat. Appl. No. 2007-518441, mailed on Dec. 7, 2012 (5 pages).

Japan Patent Office, "Translation of the Decision of Dismissal of Amendment", JP Pat. Appl. No. 2007-518441, mailed on Dec. 7, 2012 (4 pages).

* cited by examiner

LIGHT-EMITTING DIODE ARRANGEMENT, OPTICAL RECORDING DEVICE AND METHOD FOR THE PULSED OPERATION OF AT LEAST ONE LIGHT-EMITTING DIODE

CROSS-REFERENCE TO RELATED APPLICATIONS

This application is the National Stage of International Application No. PCT/DE2005/001053, filed on Jun. 13, 2005, which claims the priority to German Patent Applications Serial No. 10 2004031689.9, filed on Jun. 30, 2004 and Serial No. 10 2004042185.4, filed on Aug. 31, 2004. The contents of all applications are hereby incorporated by reference in their entireties.

FIELD OF THE INVENTION

The invention relates to a light-emitting diode array, an optical recording apparatus, and a method for the pulsed operation of at least one light-emitting diode.

BACKGROUND OF THE INVENTION

The document U.S. Pat. No. 4,843,416 describes an autofocusing camera with a light-emitting diode and a pulse-generating circuit. The pulse-generating circuit is used to generate an individual flash of light by means of the diode. A photodiode receives the light pulse reflected by an object. The amplitude of the received light pulse is used to determine the distance from the object.

The document U.S. Pat. No. 6,185,240 describes a laser diode which has a second diode connected in antiparallel with it. The second diode constitutes here a protection against electrostatic discharge (ESD) for the laser diode. It protects the laser diode against ESD voltage pulses which may occur in the reverse direction of the laser diode.

The document WO 98/12757 describes a semiconductor component with a radiation-emitting semiconductor chip which emits electromagnetic radiation in the blue spectral range between 420 nm and 460 nm. The semiconductor chip is at least partially enclosed by a sealing compound which contains a luminescence-conversion material which is suitable for converting part of the radiation emitted by the semiconductor chip into radiation with a relatively long wavelength, preferably in the yellow spectral range. The semiconductor component therefore emits mixed radiation which is composed of the wavelength-converted component of the radiation and the original radiation of the semiconductor chip. The semiconductor component preferably emits white light.

SUMMARY OF THE INVENTION

An object of the present invention is to disclose a light-emitting diode array which can be used in a particularly versatile way. Furthermore, an object of the present invention is to disclose an optical recording apparatus which is as compact and power-efficient as possible and has such a light-emitting diode array. In addition, an object of the invention is to disclose a light-emitting diode array which is suitable for use in an optical recording apparatus. Furthermore, a particularly power-efficient method for the pulsed operation of at least one light-emitting diode is specified.

A light-emitting diode array is specified which has two light-emitting diodes which are connected in antiparallel with one another. That is to say if an external voltage is applied to the light-emitting diode array, one of the light-emitting diodes is connected in the forward direction and the other light-emitting diode is connected in the reverse direction. The light-emitting diodes each have at least one light-emitting diode chip. Furthermore, it is possible for the light-emitting diodes to be formed by one individual light-emitting diode chip each.

Furthermore, a device is provided which is suitable for energizing the light-emitting diodes with current in alternating directions. That is to say, for example, each of the two light-emitting diodes can be alternately connected in the forward direction and reverse direction by means of this device. If a voltage is applied to one of the light-emitting diodes in the reverse direction, a voltage is applied in the forward direction to the other light-emitting diode. The light-emitting diodes of the light-emitting diode array are therefore suitable for emitting electromagnetic radiation alternately. Moreover it is also possible here for no voltage to be applied to the light-emitting diodes for a specific time period.

A light-emitting diode array is therefore disclosed which has two light-emitting diodes which are connected in antiparallel with one another and in which a device is provided which is suitable for energizing the light-emitting diodes with current in alternating directions. For example, the device is a power supply which is suitable for energizing the light-emitting diodes independently of one another in the forward direction.

In one embodiment of the light-emitting diode array the device is suitable for energizing the light-emitting diode array for predefinable time periods with current with a predefinable direction and strength. In this way, the light-emitting diodes can emit electromagnetic radiation alternately when the light-emitting diode array is operated for predefinable time periods. The intensity of the electromagnetic radiation can be regulated here by the predefinable strength of the current with which the respective light-emitting diode is operated in the forward direction.

The voltage which is applied to the light-emitting diode array is preferably selected to be so small that that light-emitting diode at which a voltage is present in the reverse direction is not damaged. That is to say the voltage which is applied does not exceed the breakdown voltage of the diode.

In the light-emitting diode array which is energized by means of the device it is possible, for example, to select the time period for which in each case a current of a predefinable direction can flow through the light-emitting diode array in such a way that the current can flow through the light-emitting diode array for longer in one specific direction than in another direction. This advantageously ensures that during the operation of the light-emitting diode array one of the light-emitting diodes emits electromagnetic radiation for a longer time period than the other light-emitting diode.

The device is also preferably suitable for permitting a larger current to be selected in one direction than in the other direction. For example, while the light-emitting diode array is operating it is thus possible for a relatively high current always to flow in the forward direction through the light-emitting diode which is energized for a relatively long time period in the forward direction than through the other light-emitting diode. The other light-emitting diode is then operated for a shorter time period with a lower current strength in the forward direction. However, it is also possible for the two light-emitting diodes to be operated for respectively identically long time periods with respectively identical current strengths in the forward direction.

The device is particularly preferably a pulse-width-modulation circuit. With such a pulse-width-modulation circuit it is possible for the current strength, the direction of current and the time period for which a current with a predefinable strength and predefinable direction is to flow to be set as precisely and as easily as possible.

In one preferred embodiment of the light-emitting diode array, the light-emitting diodes are arranged in a common housing. For this purpose the light-emitting diodes may, for example, both be accommodated in a recess in a housing base body.

In one particularly preferred embodiment of the light-emitting diode array, the light-emitting diodes are suitable for emitting electromagnetic radiation with different wavelengths. For example, one of the light-emitting diodes may be suitable for emitting light in the red spectral range. The other light-emitting diode is then suitable, for example, for emitting light in the blue spectral range.

In a further embodiment of the light-emitting diode array, a luminescence-conversion material is provided which is suitable for at least partially converting the wavelength of the electromagnetic radiation which is emitted by one of the light-emitting diodes. That is to say a luminescence-conversion material is arranged downstream of at least one of the light-emitting diodes in an irradiation direction and said material absorbs part of the radiation emitted by the light-emitting diode and subsequently emits radiation with a different wavelength. The luminescence-conversion material preferably emits radiation with a larger wavelength than the wavelength of the radiation which was originally emitted by the light-emitting diode. Resulting radiation is obtained as a result of the mixture of the portion of radiation whose wavelength has been converted with the radiation which was originally emitted by the light-emitting diode.

The wavelength of the radiation emitted by the light-emitting diode can also be essentially completely converted by the luminescence-conversion material, for example in order to convert invisible radiation into visible light. If at least two different luminescent substances which are contained in the luminescence-conversion material are used, it is possible in this way to generate mixed light of the radiation emitted by the two luminescent substances. Organic and inorganic luminescent substances which are suitable for wavelength conversion of electromagnetic radiation are described, for example, in the document WO 98/12757 whose content regarding the luminescent substances is herewith in this regard incorporated by back reference.

In a further embodiment of the light-emitting diode array, the luminescence-conversion material may be applied, for example, in a thin layer to the radiation discharge face of at least one of the light-emitting diodes. However, it is also possible for a luminescence-conversion material to be applied in a thin layer to just one of the light-emitting diodes. Furthermore it is possible for in each case a luminescence-conversion material which may contain different luminescent substances to be applied to the two light-emitting diodes. The luminescent substances may be adapted here to the respective electromagnetic radiation which is generated by the light-emitting diode.

In a further embodiment of the light-emitting diode array, it is possible for the light-emitting diodes to be surrounded by a common sealing compound. The sealing compound preferably contains a luminescence-conversion material. It is particularly preferred if one of the light-emitting diodes is suitable for emitting electromagnetic radiation with a wavelength which can pass through the sealing compound largely unimpeded. In this context largely unimpeded means that the wavelength of the electromagnetic radiation emitted by this light-emitting diode is not converted, or is only converted to an insignificant degree, by the luminescence-conversion material present in the sealing compound. The radiation therefore exits the sealing compound with the same wavelength with which it was emitted by the light-emitting diode without a significant portion of this radiation being absorbed by components of the sealing compound. The wavelength of at least some of the radiation emitted by the other light-emitting diode are preferably converted by the luminescence-conversion material.

In one particularly preferred embodiment of the light-emitting diode array, that portion of the electromagnetic radiation emitted by one of the light-emitting diodes whose wavelength is converted can mix with the electromagnetic radiation originally emitted by this light-emitting diode to form mixed light. The mixed light is particularly preferably white light.

This means that one of the light-emitting diodes is, for example, suitable for emitting electromagnetic radiation in the ultraviolet/blue spectral range. The maximum value of the wavelength of the radiation emitted by the light-emitting diode is preferably between 420 nm and 470 nm. The luminescence-conversion material is then suitable, for example, for converting part of this radiation into electromagnetic radiation in the green/yellow spectral range. The maximum value of the relative spectral emission of the converted radiation is preferably in the wavelength range between 530 nm and 580 nm. The mixed light obtained is advantageously white light.

In one further embodiment of the light-emitting diode array one of the light-emitting diodes is suitable for generating electromagnetic radiation in the red, green or yellow spectral ranges.

One of the light-emitting diodes is preferably suitable for emitting electromagnetic radiation in the red spectral range with a maximum value of the wavelength of the emitted radiation between 600 nm and 750 nm.

The light-emitting diode array makes use, inter alia, of the idea that by energizing the light-emitting diode array in alternating directions of the radiation emitted by the light-emitting diode array a specific portion of red light is added to it. If, for example, white light is irradiated by the light-emitting diode array by partial conversion of blue light into yellow light, the white light generated in this way contains a very small portion of red. The selected addition of red light by the light-emitting diode which emits red light being energized for predefinable time periods with a predefinable current strength in the forward direction can overcome this deficiency in red light. If, instead of one of the light-emitting diodes which emits light in the red spectral range, a light-emitting diode is selected which emits light, for example, in the green spectral range, in this way a defined portion of green light can be added to the radiation of the light-emitting diode array. Overall, the colour reproduction index of the light-emitting diode array can be advantageously increased in this way.

It also proves particularly advantageous with the light-emitting diode array that the two light-emitting diodes which are connected in antiparallel with one another are a mutual protection against electrostatic discharge in the reverse direction. Such ESD voltage pulses may adversely affect the function of an optoelectronic component or even destroy it. If a current then flows through the light-emitting diode array owing to such an ESD voltage pulse, it is conducted away in the forward direction through one of the light-emitting diodes. The risk of either light-emitting diode breaking down is thus reduced.

In a further preferred embodiment of the light-emitting diode array, at least one further light-emitting diode can be connected in series with at least one of the light-emitting diodes which are connected in antiparallel with one another. For example it is possible for a light-emitting diode which emits green light to be connected in series with a light-emitting diode which emits red light. It is then possible, for example, for a light-emitting diode which emits blue light to be connected in antiparallel with these two light-emitting diodes. By alternating energization of the light-emitting diode array it is possible here to generate, for example, white light with an increased portion of red light and green light.

One of the light-emitting diode arrays just described is particularly preferably used as an illumination device in interior lighting systems of vehicles or aircraft or in video cameras and still cameras. A light-emitting diode array which irradiates white light with an increased portion of red light proves particularly advantageous in this context. For example, when such a light-emitting diode array is used as an illumination device in the interior lighting system of a vehicle, a road map which is illuminated by the light-emitting diode array described can be read better. Persons who are illuminated with such a light-emitting diode array also appear less pale in comparison to illumination with a conventional light-emitting diode array without an increased portion of red light. This also proves particularly advantageous, for example, when the light-emitting diode array is used in video cameras or still cameras.

In a further embodiment, at least one of the light-emitting diodes has at least one light-emitting diode chip in which a large part of the electromagnetic radiation generated in the light-emitting diode chip exits in the main irradiation direction through a radiation discharge face or is formed by such a light-emitting diode chip. The electromagnetic radiation particularly preferably exits exclusively through the radiation discharge face of the light-emitting diode chip.

The light-emitting diode chip preferably contains an epitaxially grown stack of layers. The stack of layers is, for example, a sequence of epitaxially grown layers. The stack of layers preferably comprises at least one active zone which is suitable for generating electromagnetic radiation.

For this purpose, the active zone may have, for example, a pn-type junction, a double heterostructure, a single quantum well structure or, particularly preferably, a multiple quantum well structure (MQW). The term quantum well structure comprises, within the scope of the application, any structure in which charge carriers experience quantization of their energy states through confinement. In particular, the term quantum well structure does not contain any information about the dimensions of the quantization. It thus comprises, inter alia, quantum wells, quantum wires and quantum points, and any combination of these structures.

The stack of layers is particularly preferably a sequence of epitaxially grown layers from which the grown-on substrate has been removed after the epitaxial growth process has finished. A carrier is particularly preferably applied to the surface of the stack of layers which faces away from the original grown-on substrate. Components which are manufactured by removing the grown-on substrate from an epitaxially grown series of layers are often also referred to by the term thin-film layer components.

A basic principle of a thin-film layer component is described, for example, in Schnitzer I. et al., "30% external quantum efficiency from surface textured LEDs", Appl. Phys. Lett., October 1993, volume 63, pages 2174-2176, the disclosed content of which relating to the basic principle of thin-film layer components is herewith incorporated by back reference.

A thin-film light-emitting diode chip is, in a good approximation, a Lambert surface radiator and is therefore particularly suitable, for example, for application in a headlight.

It is particularly advantageous that the carrier can be relatively freely selected compared to the grown-on substrate. For example, the carrier may be more suitable in terms of many properties such as conductivity or stability for the component than available grown-on substrates which are subject to tight restrictions for the manufacture of high-quality, epitaxially grown series of layers. For example, in order to obtain high-quality, epitaxial layers, the epitaxially deposited material must be lattice-matched to the grown-on substrate.

The carrier which is applied to the stack of layers is preferably distinguished by a thermal coefficient of expansion which is matched to the stack of layers. For example, the carrier may contain a semiconductor material such as germanium, gallium arsenide, gallium nitride, silicon carbide and other materials such as sapphire, molybdenum or metals.

Furthermore, the carrier is preferably distinguished by a particularly good thermal conductivity so that the heat which is produced in the active zone when electromagnetic radiation is generated can be emitted to the surroundings at least partially via the carrier.

According to one preferred refinement of the light-emitting diode chip, a mirrored layer is arranged between the applied carrier and the stack of layers. The mirrored layer may comprise, for example, a Bragg mirror or a metal-containing mirrored layer. A metal-containing mirror which can contain, for example, gold, gold germanium, silver, aluminium or platinum, is distinguished in comparison with a Bragg mirror by, for example, a lower directional dependency of the reflectivity. With metal-containing mirrors it is also possible to obtain a higher degree of reflectivity than with Bragg mirrors.

Both light-emitting diodes particularly preferably have at least one light-emitting diode chip of a thin-film design.

According to at least one embodiment of the light-emitting diode array, the light-emitting diode array has an optical detector which is suitable for detecting an electromagnetic radiation pulse which is reflected by an object. The radiation pulse is preferably a reflection of an electromagnetic radiation pulse which is emitted by one of the light-emitting diodes. The detector may be located either inside or outside the housing of the light-emitting diode array in this context. The detector is preferably suitable for detecting the light from the two light-emitting diodes.

Furthermore, an evaluation circuit is provided in the light-emitting diode array, said circuit being suitable for determining the distance between the object and the detector using the detector signal. The distance between the detector and the object may be calculated by means of the evaluation circuit from the time between the emission of the radiation pulse and reception of the pulse reflected by the object, for example. Moreover it is also possible for the evaluation circuit to determine the distance from the object by comparing the original pulse with the reflected pulse. In this context, the distance from the object may be determined, for example, by comparing the pulse shapes. It is also preferably possible to determine the distance from the object by comparing the pulse amplitudes.

According to at least one embodiment of the light-emitting diode array, it is also possible for the light-emitting diode array to have two light-emitting diodes which can emit light with different wavelengths and for the reflection of radiation pulses from the two light-emitting diodes to be used to determine distances. In this way it is possible to determine the distance from an object particularly precisely. It is thus possible, for example, for the reflected pulses of the two light-emitting diodes to be evaluated by means of different evaluation algorithms. The distance from the object for the reflection of the pulse of a light-emitting diode may be determined, for example, by means of a difference in propagation time. The reflection of the pulse of the other light-emitting diode may be used to determine the distance by means of a pulse amplitude or pulse shape comparison.

Overall, the light-emitting diode array is particularly suitable for use in optical recording apparatus or in devices for measuring distances.

In addition, an optical recording apparatus with a light-emitting diode array according to at least one of the embodiments described above is disclosed.

In a first embodiment of the optical recording apparatus, an optical recording apparatus is disclosed which has two light-emitting diodes which are connected in antiparallel with one another. That is to say if a common external voltage is applied to the wiring of the light-emitting diodes, one of the light-emitting diodes is connected in the forward direction and the other light-emitting diode is connected in the reverse direction.

Furthermore, a power supply is provided which is suitable for energizing the light-emitting diodes independently of one another in the forward direction. The power supply is suitable for energizing the light-emitting diodes, for example, alternately in the forward direction. However, the power supply may also be suitable for energizing both light-emitting diodes simultaneously in the forward direction. Moreover, the power supply may, for example, be suitable for energizing one of the light-emitting diodes in a continuous operating mode in the forward direction, while the second light-emitting diode is energized in the forward direction at predefined times for predefined time periods. It may also be possible for both light-emitting diodes to be operated alternately in a continuous mode or in a pulsed mode.

In one embodiment, an optical recording apparatus is therefore disclosed which has two light-emitting diodes which are connected in antiparallel with one another and a power supply which is suitable for energizing the light-emitting diodes independently of one another in the forward direction.

The light-emitting diodes are preferably arranged in a common housing. The power supply of the light-emitting diodes may be arranged, for example, outside the housing. The housing is preferably configured in a surface-mountable fashion. In this way, at least one optical element, for example, can be arranged in a particularly space-saving fashion downstream of the light-emitting diodes in a main irradiation direction. The optical element may be attached to parts of the housing. The optical element may be a refractive, diffractive, holographic or also reflective optic system. Furthermore, the optical element may be optimized for a plurality of light-emitting diodes. That is to say the optical element is constructed in this case in such a way that it acts as an optical element for all the light-emitting diodes. It is possible, for example, for the light discharge face of the optical element to be correspondingly designed for this purpose.

The light-emitting diodes are preferably at least partially surrounded by a common sealing compound. The sealing compound is preferably at least partially transparent to the electromagnetic radiation emitted by the light-emitting diodes. The sealing compound may form an optical element, for example. The optical properties of the optical element can be set in a defined fashion by, for example, the selection of the refractive index and the shape of the boundary faces of the sealing compound through which the electromagnetic radiation generated by the light-emitting diodes leaves the sealing compound. It is also possible for a separate optical element to be applied to at least parts of the sealing compound.

In a further embodiment of the optical recording apparatus, the light-emitting diodes are suitable for emitting light with different wavelengths. For example, one of the light-emitting diodes may be suitable for generating light in the infrared or red spectral range while the other light-emitting diode is suitable for generating light in the blue spectral range. However, it is also possible for both light-emitting diodes to emit light in the same spectral range. It is in particular also possible here for the light-emitting diodes to emit light with the same wavelength.

The light-emitting diodes are preferably dimensioned in different ways, i.e. the light-emitting diodes may differ in terms of their characteristic variables such as their electrical power drain or their relative brightness.

The optical recording apparatus makes use, inter alia, of the idea that by arranging two different light-emitting diodes in a common housing an arrangement of light-emitting diodes which can be used in a particularly versatile way can be integrated into an optical recording apparatus particularly economically in terms of space. In addition, the spatially close arrangement of the light-emitting diodes permits the light-emitting diodes to use a common optical element.

In a further embodiment of the optical recording apparatus, a luminescence-conversion material is provided which is suitable for at least partially converting the wavelength of the electromagnetic radiation emitted by at least one of the light-emitting diodes. This means at least one of the light-emitting diodes has a luminescence-conversion material arranged downstream of it in the irradiation direction, said material absorbing at least part of the radiation emitted by the light-emitting diode chip and subsequently emitting radiation with a different wavelength. The luminescence-conversion material preferably emits radiation with a larger wavelength than the wavelength of the radiation which was originally emitted by the light-emitting diode. Resulting radiation is obtained by mixing the portion of the radiation whose wavelength has been converted with the radiation which was originally emitted by the light-emitting diode.

The wavelength of the radiation which is emitted by the light-emitting diode can also be essentially completely converted by the luminescence-conversion material, in order, for example, to convert invisible radiation into visible light. If at least two different luminescent substances which are contained in the luminescence-conversion material are used, it is possible in this way to generate mixed light of the radiation emitted by the two light-emitting diodes.

In a further embodiment, the luminescence-conversion material may be applied, for example, in a thin layer to the radiation discharge face of at least one of the light-emitting diodes. However, it is also possible for a luminescence-conversion material to be applied in a thin layer to just one of the light-emitting diodes. Furthermore, it is possible for in each case a luminescence-conversion material which can contain different luminescent substances to be applied to the two light-emitting diodes. The luminescent substances may be adapted here to the respective electromagnetic radiation which is generated by the light-emitting diode.

The common sealing compound can preferably also contain the luminescence-conversion material. One of the light-emitting diodes is particularly preferably suitable for emitting electromagnetic radiation with a wavelength which can pass through the sealing compound largely unimpeded. In this context, largely unimpeded means that the wavelength of the electromagnetic radiation emitted by this light-emitting diode is not converted, or is only converted to an insignificant degree, by the luminescence-conversion material present in the sealing compound. The radiation therefore exits the sealing compound with the same wavelength with which it was emitted by the light-emitting diode without a significant portion of this radiation being absorbed by components of the sealing compound. The wavelength of the electromagnetic radiation of the other light-emitting diode is then preferably at least partially converted.

According to at least one embodiment of the optical recording apparatus, that portion of the electromagnetic radiation which is emitted by one of the light-emitting diodes and whose wavelength is converted can be mixed with the electromagnetic radiation which was originally emitted by this light-emitting diode to form mixed light. The mixed light is particularly preferably white light.

That is to say, one of the light-emitting diodes is suitable, for example, for emitting electromagnetic radiation in the ultraviolet/blue spectral range. The maximum value of the wavelength of the radiation which is emitted by the light-emitting diode is preferably between 420 nm and 470 nm here. The luminescence-conversion material is then suitable, for example, for converting part of this radiation into electromagnetic radiation in the green/yellow spectral range. The maximum value of the relative spectral emission of the emitted radiation is preferably in the wavelength range between 530 nm and 580 nm here. The mixed light obtained is white light.

It is also possible for both light-emitting diodes to emit light in the ultraviolet/blue spectral range. As a result, the light of the two light-emitting diodes can be mixed with the light emitted by the luminescence-conversion material to form white light.

Moreover it is also possible for the white light of at least one of the light-emitting diodes to be generated by at least one red, at least one green and at least one blue light-emitting diode chip which is contained in the light-emitting diode.

In a further embodiment, one of the light-emitting diodes is suitable for generating electromagnetic radiation in the red, green, blue or yellow spectral range.

In a further embodiment of the optical recording apparatus, an optical detector is provided. The optical detector is suitable for detecting an electromagnetic radiation pulse which is reflected by an object. The detector is preferably suitable for detecting a radiation pulse which is the reflected pulse of a radiation pulse which has been emitted by one of the light-emitting diodes. The detector can, for this purpose, be adapted in its sensitivity to the wavelength of the electromagnetic radiation emitted by the light-emitting diode, i.e. the detector is preferably particularly sensitive in the wavelength range of the electromagnetic radiation which is emitted by the light-emitting diode. For this purpose, one of the light-emitting diodes is preferably suitable for generating radiation pulses in the infrared spectral range. The detector is preferably particularly sensitive in the infrared radiation range.

Furthermore, an evaluation circuit is provided which is suitable for determining the distance between the object and the detector using the detector signal. The distance between the detector and the object may be calculated by means of the evaluation circuit from the time between the emission of the radiation pulse and reception of the pulse reflected by the object, for example. Moreover it is also possible for the evaluation circuit to determine the distance from the object by comparing the original pulse with the reflected pulse. In this context, the distance from the object may be determined, for example, by comparing the pulse shapes. It is preferably also possible to determine the distance from the object by comparing the pulse amplitudes.

The distance between an object and the detector which is determined in this way may be used in an auto-focusing system of the optical recording apparatus.

In a further embodiment of the optical recording apparatus, at least one of the light-emitting diodes is suitable for generating flash light with an illumination period of up to 500 ms, typically 300 ms. However, the illumination period may also be shorter and be, for example, between 100 ms and 200 ms. A device which is suitable for energizing at least one of the light-emitting diodes for these time periods is preferably provided in the optical recording apparatus. The device may be a pulse-width-modulation circuit.

Both light-emitting diodes are particularly preferably suitable for generating flash light in the way described. The device can then be used for generating pulses for the two light-emitting diodes. It is in particular possible here for the light which is emitted by at least one of the light-emitting diodes to mix with the portion of the radiation whose wavelength has been converted to form white light. In this way, both light-emitting diodes are particularly preferably suitable for generating white flash light.

In a further embodiment of the optical recording apparatus, the illumination intensity of the flash light can be set in a defined fashion, i.e. the device for pulsed energization is suitable, for example, for adapting the pulse length to measured variables. The pulse length is therefore preferably determined by means of a control variable. The control variable is preferably a measured value, for example the ambient brightness. It is thus sufficient, for example, when the ambient brightness is high, to generate flash light with a lower illumination intensity. The pulse length of the flash light can then be reduced, for example. The pulse length of the flash light can, however, also be matched to the illumination period of the optical recording apparatus.

In a further embodiment of the optical recording apparatus, at least one pulse-width-modulation circuit is provided which is suitable for operating at least one of the light-emitting diodes in a pulsed fashion. By means of the pulse-width-modulation circuit it is possible, for example, to regulate the light intensity of the light-emitting diode during operation. The shorter the connection times of the light-emitting diode in comparison with the switch-on times, the brighter the light of the light-emitting diode appears. In this way it is possible, for example, to operate at least one of the light-emitting diodes as a dimmable light source.

In a further embodiment of the optical recording apparatus a device is provided which is suitable for energizing at least one of the light-emitting diodes in synchronism with an image recording sequence which is controlled by the optical recording apparatus. The device may be, for example, a pulse-width-modulation circuit. The device preferably controls both the flash light and the image recording sequence. It is thus possible, for example when recording a video sequence by means of the optical recording apparatus, to illuminate each individual frame of the video recording with an associated light flash. Owing to the inertia of the processing of visual signals, the sequence appears as continuously illuminated to the viewer. However, the precise matching of the illumination pulse to the image recording process has the advantage over a continuous operating mode of the light-emitting diode that it is particularly energy-efficient. Furthermore, in the pulsed operating mode of the light-emitting diode the generation of heat as a result of the operation of the light-emitting diode is reduced in comparison with the continuous operating mode. This advantageously reduces the expenditure which is necessary for sufficient cooling of the light-emitting diode.

In all the previously mentioned embodiments it is particularly advantageous that the two light-emitting diodes which are connected in antiparallel with one another constitute a mutual protection against electrostatic discharge in the reverse direction. Such ESD voltage pulses may adversely affect the function of an optoelectronic component or even destroy it. If a current flows through the light-emitting diode array owing to such an ESD voltage pulse, said current is conducted away through one of the light-emitting diodes in the forward direction. The risk of the other light-emitting diode breaking down is thus reduced.

In a further embodiment of the optical recording apparatus the optical recording apparatus is one of the following pieces of equipment: mobile phone with a camera, digital camera, video camera, still camera. The power-efficient and space-saving arrangement of the light-emitting diodes is particularly advantageous in these pieces of equipment.

In addition, a method for the pulsed operation of at least one light-emitting diode is disclosed, wherein the light-emitting diode is energized in synchronism with an image recording sequence which is controlled by an optical recording apparatus. The energization of the light-emitting diode is preferably controlled here by the same mechanism as the image recording sequence. That is to say the optical recording apparatus preferably controls both the energization of the light-emitting diode and the image recording sequence. The light-emitting diode may either be integrated in a housing of the optical recording apparatus or arranged outside as an external illumination source here. In this way it is possible, in particular, for a multiplicity of light-emitting diodes to be energized by the optical recording apparatus in synchronism with the image recording process. As described above, the synchronous operation of the light-emitting diodes is particularly suitable for video recordings. When a plurality of light-emitting diodes are used, the video sequence can then be advantageously illuminated from various directions.

Moreover it is possible for a further light-emitting diode as an ESD protection to be connected in antiparallel with the light-emitting diode. However, it is also possible that, for example, a zener diode or an electrical resistor as an ESD protection is connected in parallel with the light-emitting diode.

The light-emitting diode array will be explained in more detail below with reference to exemplary embodiments and the associated figures.

DETAILED DESCRIPTION OF THE PREFERRED EMBODIMENTS

In the exemplary embodiments and figures identical or identically acting components are respectively provided with the same reference symbols. The illustrated components and the size relationships between the components are not to be considered as being to scale. Instead, a number of details of the figures have been illustrated in an exaggeratedly large form for the sake of better understanding.

Figure 1:
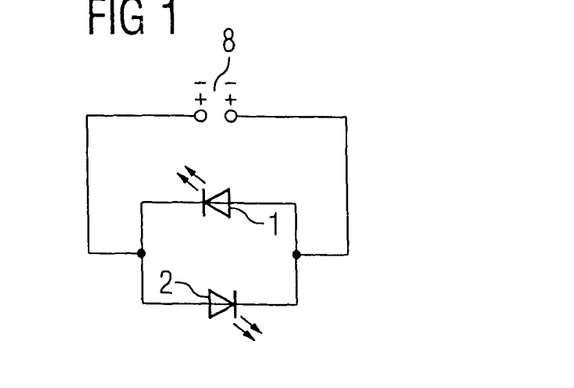
FIG. 1 shows an exemplary equivalent circuit diagram of a first exemplary embodiment of the light-emitting diode array described here.

FIG. 1 shows an exemplary equivalent circuit diagram of a first exemplary embodiment of the light-emitting diode array described here. The light-emitting diode array has a first light-emitting diode 1 and a second light-emitting diode 2 which are connected in antiparallel with one another. The first light-emitting diode 1 is suitable, for example, for generating light with a wavelength $\lambda_1$, while the second light-emitting diode is suitable for generating light with a wavelength $\lambda_2$. The light-emitting diodes which are connected in antiparallel with one another are energized with current in alternating directions by a pulse-width-modulation circuit 8.

In this context, the first light-emitting diode 1 is energized, for example, for a time period $t_1$ with a current of the strength $I_1$ in the forward direction so that it emits electromagnetic radiation with the wavelength $\lambda_1$ for the time period $t_1$.

The second light-emitting diode 2 is energized with a current $I_2$ in the forward direction for a time period $t_2$ so that it emits electromagnetic radiation with the wavelength $\lambda_2$ for the time period $t_2$.

Figure 4A:
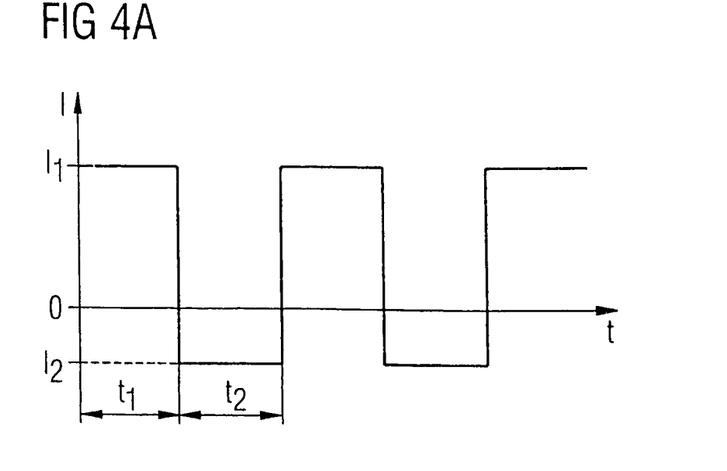
FIG. 4A shows, by way of example, a current/time diagram for an exemplary embodiment of the light-emitting diode array.

FIG. 4A shows in this respect an exemplary current/time diagram of the light-emitting diode array in which the current $I_1$ flows for a time period $t_1$, and the current $I_2$ flows for a time period $t_2$, respectively.

The frequency of the pulse-width-modulation circuit is given by $1/(t_1+t_2)$. The frequency of the pulse-width-modulation circuit is preferably larger than or equal to 100 Hz. For the human eye the two wavelengths $\lambda_1$ and $\lambda_2$ can therefore not be perceived separately but instead the two wavelengths mix to form a light with portions of the wavelengths $\lambda_1$ and $\lambda_2$. The time periods $t_1$ and $t_2$ may either be of equal length or have different lengths here. If, for example $t_1 > t_2$, the light emitted by the light-emitting diode array has a larger portion of the wavelength $\lambda_1$.

Figure 4B:
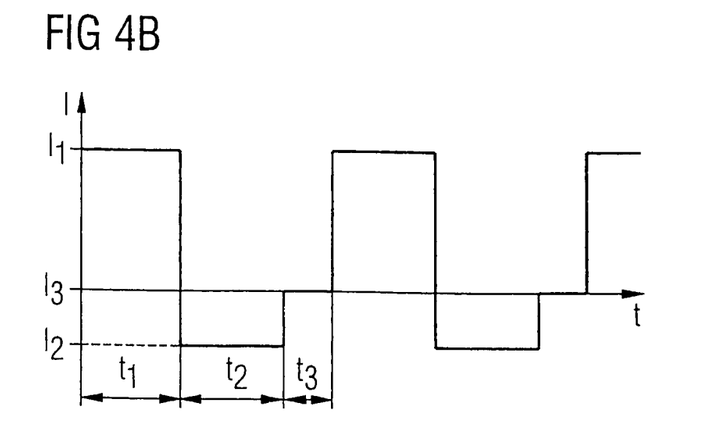
FIG. 4B shows, by way of example, a current/time diagram for an exemplary embodiment of the light-emitting diode array.

Moreover, it is also possible, as shown by FIG. 4B, that no current, that is to say $I_3=0$, flows through the light-emitting diode array for a specific dead time $t_3$. In this way, the radiation power of the light-emitting diode array can be regulated. The longer the time period $t_3$ for which no current flows through the array relative to $t_1$ and $t_2$, the less bright the light emitted by the array appears. It is in turn important here that the time periods are short enough for the human observer to see no flickering in the emitted light.

Figure 2:
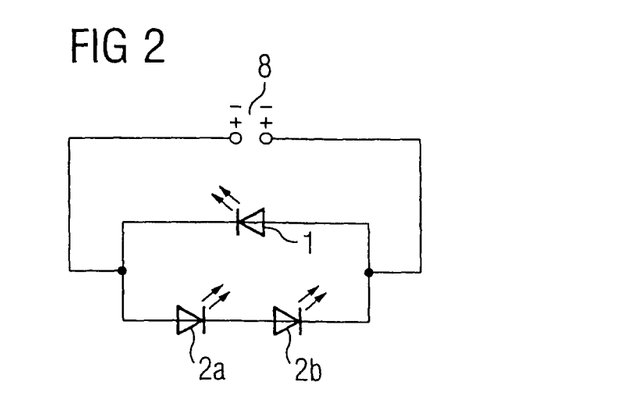
FIG. 2 shows an exemplary equivalent circuit diagram of a second exemplary embodiment of the light-emitting diode array described here.

FIG. 2 shows an equivalent circuit diagram of a second exemplary embodiment of the light-emitting diode array. Here, two light-emitting diodes 2*a* and 2*b* are connected in series with one another, and the first light-emitting diode 1 is connected in antiparallel with this series circuit. The light-emitting diodes 2*a* and 2*b* are correspondingly operated simultaneously in the forward direction for a time period $t_2$ and in the process emit electromagnetic radiation with the wavelengths $\lambda_{2a}$ and $\lambda_{2b}$. In this way, it is possible to add a further light component to the electromagnetic radiation emitted by the light-emitting diode array.

Figure 3:
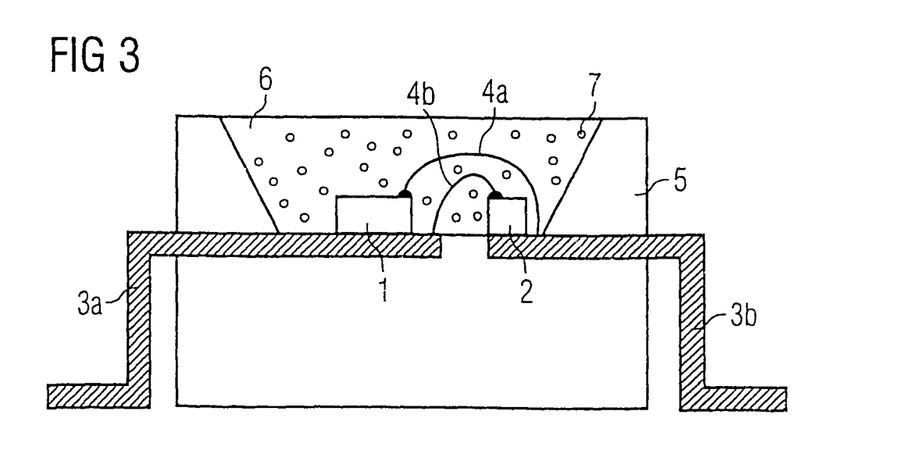
FIG. 3 shows a schematically represented cross section through an exemplary embodiment of the light-emitting diode array described here.

FIG. 3 shows a schematically illustrated cross section through an exemplary embodiment of the light-emitting diode array. Here, the first light-emitting diode 1 is, for example, a light-emitting diode chip which is suitable for emitting electromagnetic radiation in the wavelength range between 420 nm and 470 nm. The maximum value of the emitted radiation is preferably 450 nm. It is possible, for example, for the light-emitting diode 1 to be an individual light-emitting diode chip.

The first light-emitting diode 1 may be operated in the forward direction with, for example, a current of $I_1$ equal to 350 mA. It is preferably operated in the forward direction for a time period $t_1$ equal to 50 ms. The light-emitting diode 1 is bonded to a first connecting part 3*a* and placed in contact with the second connecting part 3*b* via a wire bonding contact 4*a*. The second light-emitting diode 2 is connected in antiparallel with this and bonded, for example to the second connecting part 3*b*, and is placed in contact with the first connecting part 3*a* by means of a wire bonding contact 4*b*. The second light-emitting diode 2 may be, for example, an individual light-emitting diode chip.

The second light-emitting diode 2 is, for example, suitable for emitting electromagnetic radiation in the red spectral range. The maximum value of the radiation emitted by the second light-emitting diode 2 is preferably between 600 nm and 750 nm. The second light-emitting diode 2 is particularly preferably energized in the forward direction with a current of the current strength $I_2$ between 1 mA and 30 mA for a time period $t_2$. The time period is preferably approximately 50 ms here. Both light-emitting diodes 1 and 2 are arranged in the recess in a base body 5 and are surrounded by a common sealing compound 6.

The sealing compound 6 preferably contains an epoxy casting resin or silicone which is transparent to the electromagnetic radiation emitted by the light-emitting diodes 1 and 2. Furthermore, the sealing compound 6 preferably contains a luminescence-conversion material 7 which is suitable for converting part of the blue light emitted by the light-emitting diode 1 into light of the yellow spectral range. The yellow light lies preferably in a spectral range between 530 nm and 580 nm here. The maximum value of the wavelength of the yellow light is particularly preferably approximately 565 nm.

The blue light of the light-emitting diode 1 and the yellow light of the luminescence-conversion material mix to form white light. The colour coordinates of the white light are given here, for example, by $C_x$ equal to 0.32, and $C_y$ equal to 0.31 according to CIE 1931. The colour temperature is preferably approximately 6500 K.

The light-emitting diode array therefore emits white light for a time period $t_1$, and red light for a time period $t_2$. The portion of red light may be increased here, on the one hand, by extending the time period $t_2$ in comparison with $t_1$, or on the other hand by increasing the current strength $I_2$ with which the second light-emitting diode 2 is operated. It is also possible for further light-emitting diodes 2*b* which irradiate red light to be connected in series according to FIG. 2. The red light of the second light-emitting diode 2 preferably passes through the sealing compound without having its wavelength converted by the luminescence-conversion material.

The light-emitting diodes 1, 2 which are connected in antiparallel with one another advantageously constitute a mutual ESD protection for one another in the reverse direction. For example, in this way the light-emitting diode array is ESD-protected up to 2 kV according to JESD 22-A114-B.

Figure 5:
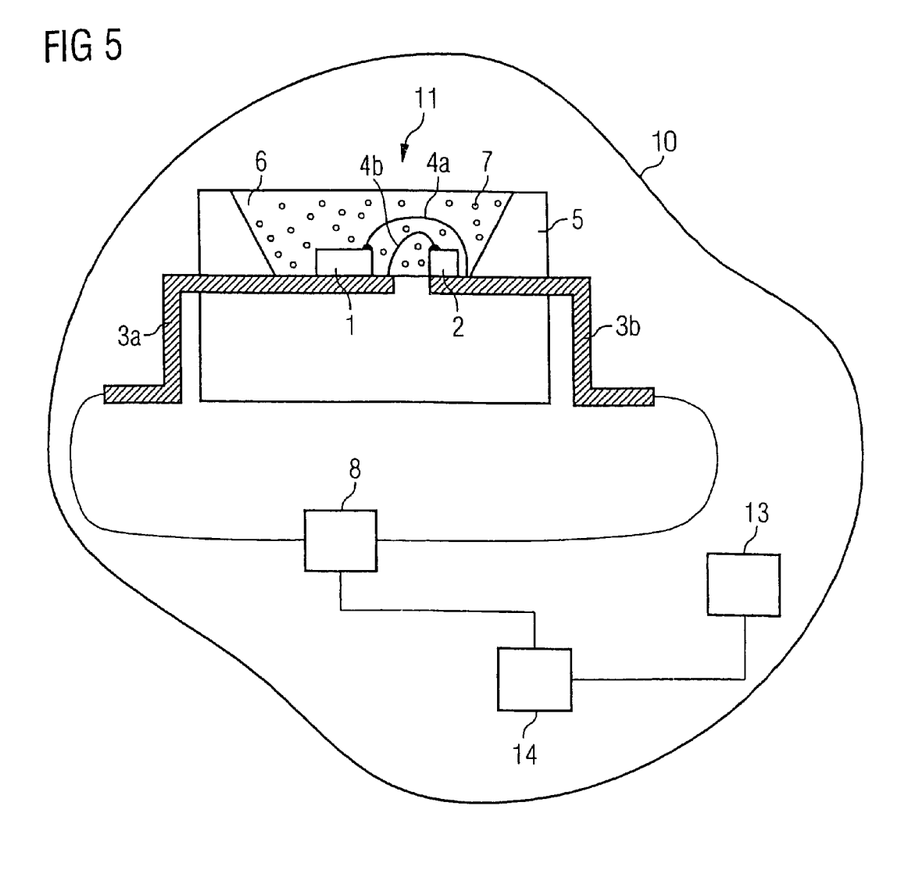
FIG. 5 shows a schematically represented cross section through an exemplary embodiment of the light-emitting diode array described here, in the optical recording apparatus described here.

FIG. 5 shows a schematically illustrated cross section through an exemplary embodiment of a light-emitting diode array 11 in an optical recording apparatus 10.

The first light-emitting diode 1 is, for example, suitable for emitting electromagnetic radiation in the ultraviolet/blue spectral range. It is suitable, for example, for emitting electromagnetic radiation between 420 nm and 470 nm. The maximum value of the emitted radiation is preferably 450 nm. The first light-emitting diode 1 is suitable, for example, for being energized with a constant current of approximately 350 mA in the forward direction. The second light-emitting diode 2 may be identical in design to the first light-emitting diode 1. However, it is also possible for the second light-emitting diode 2 to have, for example, smaller dimensions than the first light-emitting diode 1. It can be operated in the forward direction with, for example, a current between 1 and 50 mA.

The wavelength range in which the light-emitting diode 2 is suitable for emitting electromagnetic radiation may be adapted depending on the function of the light-emitting diode 2. For example, the light-emitting diode 2 may, for example, be suitable for emitting electromagnetic radiation in the red or infrared spectral range.

Both light-emitting diodes 1, 2 are preferably arranged in a common housing. For this purpose, both light-emitting diodes 1, 2 are arranged, for example, in the recess in a base body 5, and are surrounded by a common sealing compound 6. The sealing compound 6 preferably contains an epoxy casting resin or silicone which is transparent to the electromagnetic radiation emitted by the light-emitting diodes 1, 2. Furthermore, the sealing compound 6 preferably contains a luminescence-conversion material 7 which is suitable for converting part of the, for example, blue light emitted by the light-emitting diode 1 into light of the yellow spectral range. The yellow light preferably lies here in a spectral range between 530 nm and 580 nm. The maximum value of the wavelength of the yellow light is particularly preferably approximately 565 nm. The blue light of the light-emitting diode 1 and the yellow light of the luminescence-conversion material 7 mix to form white light.

Contact can be formed between the light-emitting diodes 1, 2 and, for example, the connecting parts 3*a*, 3*b* from outside the housing, and said light-emitting diodes 1, 2 are connected in antiparallel with one another inside the housing by means of wire bonding 4*a*, 4*b*. The light-emitting diodes 1, 2 are each, for example, individual light-emitting diode chips. Furthermore it is possible for a plurality of light-emitting diode chips 1, for example four or five light-emitting diode chips, to be arranged in a common housing. The light-emitting diode 2 is then connected in antiparallel with the light-emitting diode chips 1. The light-emitting diode chips 1 can, for example, be arranged on a ceramic carrier. The light-emitting diode chips 1 may be, for example, two light-emitting diode chips which emit green light, one which emits blue light and one which emits red light. When they are operated together, the light-emitting diode chips 1 are then suitable for generating white light.

In one exemplary embodiment of the optical recording apparatus it is possible, for example, for the light-emitting diode 2 to be used as a preliminary flash for reducing the red eye effect when taking photographs. The second light-emitting diode 2 is then preferably suitable for emitting light in the blue spectral range so that the emitted electromagnetic radiation mixes with the radiation emitted by the luminescence-conversion material 7 to form white light.

It is also possible for the second light-emitting diode 2 to emit light in the red spectral range. The second light-emitting diode 2 can then be used as a preliminary flash which has a particularly protective effect for the eyes.

In a further exemplary embodiment a pulse-width-modulation circuit 8 is additionally provided, it being possible for said pulse-width-modulation circuit 8 to actuate, for example, the second light-emitting diode 2 in the forward direction. In this way it is also possible for the second light-emitting diode 2 to be used as a dimmable illumination source in the sense of a dimmable pocket lamp. The second light-emitting diode 2 is particularly preferably operated with currents between 25 and 35 mA here.

In a further exemplary embodiment it is possible to use the second light-emitting diode 2 either as a preliminary flash or as a dimmable pocket lamp.

The space-saving arrangement of the light-emitting diodes 1, 2 in the optical recording apparatus and the power-efficient second light-emitting diode 2 can be used here in a particularly advantageous way in compact pieces of equipment such as mobile telephones or digital cameras.

In a further exemplary embodiment of the optical recording apparatus, a device is provided with which it is possible to operate the first light-emitting diode 1 as a flash. The device may be, for example, a pulse-width-modulation circuit 8. The illumination period may preferably be adapted to the ambient brightness here. For this purpose it is possible, for example, for an optical detector 13 to be used to determine the ambient brightness before the flash is triggered and for the illumination period to be adapted to the value which is determined. The optical detector 13 is, for example, a photodiode or a phototransistor.

In another exemplary embodiment of the optical recording apparatus, for example the second light-emitting diode 2 is suitable for emitting light in the infrared spectral range. In addition, the optical recording apparatus has a detector 13 which is suitable for detecting the light of the second light-emitting diode 2 which is reflected by, for example, an object to be photographed. Using an evaluation circuit 14 as disclosed in the general part of the description it is then possible to determine the distance between an object and the detector 13 and thus the distance between the object and the recording apparatus. The distance information which is acquired in this way may be used, for example, to set an optic system in such a way that a focused image of the object can be taken.

In a further exemplary embodiment of the optical recording apparatus, at least one of the light-emitting diodes 1, 2 is suitable for generating electromagnetic radiation in the infrared spectral range. The light of this light-emitting diode can then be used, for example, as flash light or continuous illumination for a night sight mode of the optical recording apparatus. That is to say the optical recording apparatus is in this case suitable for receiving the reflected electromagnetic radiation of the light-emitting diodes in the infrared frequency range and converting it into light in the visible frequency range.

In a further exemplary embodiment of the optical recording apparatus, the light-emitting diodes 1, 2 constitute a mutual ESD protection in the reverse direction. The arrangement of the light-emitting diodes is preferably ESD-protected up to 2 kV according to JESD22-A114-B.

The invention is not restricted by the description referring to the exemplary embodiments. Instead, the invention comprises any new feature and any combination of features, and this includes, in particular, any combination of features in the patent claims, even if these features or this combination itself are/is not explicitly disclosed in the patent claims or exemplary embodiments.

The invention claimed is:

1. Light-emitting diode array comprising:
   two light-emitting diodes which are connected in antiparallel with one another,
   wherein a first of said light-emitting diodes is bonded to a first connecting part such that the first of said light-emitting diodes is in direct electrical contact with the first connecting part and placed in contact with a second connecting part via a first wire bonding contact and
   wherein a second of said light-emitting diodes is bonded to the second connecting part such that the second of said light-emitting diodes is in direct electrical contact with the second connecting part and is placed in contact with the first connecting part by means of a second wire bonding contact; and
   a device which is suitable for energizing the light-emitting diodes with current in alternating directions,
   wherein the two light-emitting diodes differ in terms of their electrical power drain such that the light-emitting diodes form a mutual ESD protection,
   wherein a luminescence-conversion material is provided which is suitable for at least partially converting the wavelength of the electromagnetic radiation which is emitted by the first of said light-emitting, diodes,
   wherein the electromagnetic radiation of the first of said light-emitting diodes mixes with a wavelength-converted component of its radiation to form white light,
   wherein the first of said light-emitting diodes is suitable for emitting electromagnetic radiation with a wavelength between 420 nm and 470 nm, and in which the luminescence-conversion material is suitable for converting part of this radiation into electromagnetic radiation with a wavelength between 530 nm and 580 nm,
   wherein the light-emitting diodes are surrounded by a common sealing compound which contains the luminescence-conversion material, wherein the radiation emitted by the second of said light-emitting diodes passes through the sealing compound without being converted and the radiation emitted by the first of said light-emitting diodes is at least partially converted in terms of its wavelength by the luminescence-conversion material,
   wherein at least one of the light-emitting diodes has a light-emitting diode chip, wherein all light-emitting diode chips are of a thin-film design, wherein each light-emitting diode chip contains an epitaxially grown stack of layers which comprises at least one active zone in which electromagnetic radiation is generated and a carrier, to which the epitaxially grown stack of layers is applied, wherein the epitaxially grown stack of layers is free of a growth substrate and a mirror layer is arranged between said carrier and said epitaxially grown stack of layers.

2. Light-emitting diode array according to claim 1, in which the device is suitable for energizing the light-emitting diodes for predefinable time periods with current with a predefinable direction and strength.

3. Light-emitting diode array according to claim 1, in which the device is a pulse-width-modulation circuit.

4. Light-emitting diode array according to claim 1, in which the light-emitting diodes are arranged in a common housing.

5. Light-emitting diode array according to claim 1, in which the second of the light-emitting diodes is suitable for emitting electromagnetic radiation in one of the following spectral ranges: red, green, yellow.

6. Light-emitting diode array according to claim 5, in which the second of the light-emitting diodes is suitable for emitting electromagnetic radiation in the red spectral range with a wavelength between 600 nm and 750 nm.

7. Light-emitting diode array according to claim 1, in which at least one further light-emitting diode is connected in series with at least one of the light-emitting diodes.

8. Light-emitting diode array according to claim 1, which is provided as an illumination device in one of the following pieces of equipment: interior lighting system for a motor vehicle, video camera, still camera.

9. Light-emitting diode array according to claim 1, having:
an optical detector which is suitable for detecting an electromagnetic radiation pulse of one of the light-emitting diodes which is reflected by an object, and
an evaluation circuit which is suitable for determining the distance between the object and the detector using the detector signal.

10. Optical recording apparatus, having a light-emitting diode array according to claim 1.

11. Optical recording apparatus according to claim 10, in which an optical detector is provided which is suitable for detecting an electromagnetic radiation pulse of one of the light-emitting diodes which is reflected by an object, and an evaluation circuit which is suitable for determining the distance between the object and the detector using the detector signal.

12. Optical recording apparatus according to claim 10, in which at least one of the light-emitting diodes is suitable for generating flash light with an illumination period of up to 500 ms.

13. Optical recording apparatus according to claim 12, in which the illumination intensity of the flash light can be set in a defined fashion.

14. Optical recording apparatus according to claim 10, in which at least one of the light-emitting diodes is suitable for lighting in a continuous operating mode.

15. Optical recording apparatus according to claim 10, in which a device is provided which is suitable for energizing at least one of the light-emitting diodes in synchronism with an image recording sequence which is controlled by the optical recording apparatus.

16. Optical recording apparatus according to claim 10, in which said apparatus is one of the following pieces of equipment: mobile phone with a camera, digital camera, video camera.

17. A method for the pulsed operation of at least one light-emitting diode of the light-emitting diode array according to claim 1, the method comprising:
energizing the at least one light-emitting diode in synchronization with an image sequence controlled by an optical recording device such that individual frames of the image sequence are illuminated by associated light flashed from the at least one light-emitting diode.

18. Light-emitting diode array according to claim 1, in which the two light-emitting diodes differ in terms of their relative brightness.

19. Light-emitting diode array according to claim 1, in which the first light-emitting diode is a first light-emitting diode chip and the second light-emitting diode is a second light-emitting diode chip, wherein the first and the second light-emitting diode chip differ in terms of their size.

* * * * *